(12) United States Patent
Kwon et al.

(10) Patent No.: US 8,035,056 B2
(45) Date of Patent: Oct. 11, 2011

(54) PLASMA GENERATION APPARATUS

(75) Inventors: Gi-Chung Kwon, Gwangju-si (KR);
Sang-Won Lee, Daejeon (KR);
Sae-Hoon Uhm, Namyangju-si (KR);
Jae-Hyun Kim, Daejeon (KR); Bo-Han Hong, Daejeon (KR); Yong-Kwan Lee, Daejeon (KR)

(73) Assignee: Jusung Engineering Co., Ltd., Gyeonggi-Do (KR)

( * ) Notice: Subject to any disclaimer, the term of this patent is extended or adjusted under 35 U.S.C. 154(b) by 728 days.

(21) Appl. No.: 12/111,903

(22) Filed: Apr. 29, 2008

(65) Prior Publication Data
US 2009/0183834 A1 Jul. 23, 2009

Related U.S. Application Data

(62) Division of application No. 11/356,947, filed on Feb. 16, 2006, now Pat. No. 7,411,148.

(30) Foreign Application Priority Data

Feb. 17, 2005 (KR) .................................. 2005-13187

(51) Int. Cl.
*B23K 10/00* (2006.01)
(52) U.S. Cl. ........... 219/121.43; 219/121.4; 219/121.48; 118/723 I; 156/345.48; 315/111.51

(58) Field of Classification Search ............. 219/121.43, 219/121.54, 121.57, 121.48, 121.36; 118/723 R, 118/723 I, 723 AN; 156/345.35, 345.47, 156/345.48, 345.56; 204/298.01; 315/111.51
See application file for complete search history.

(56) References Cited

U.S. PATENT DOCUMENTS

| | | | |
|---|---|---|---|
| 5,290,382 A | 3/1994 | Zarowin et al. | |
| 5,435,881 A | 7/1995 | Ogle | |
| 5,998,933 A | 12/1999 | Shun'ko | |
| 6,150,628 A | 11/2000 | Smith et al. | |
| 6,392,351 B1 | 5/2002 | Shun'ko | |
| 6,418,874 B1 | 7/2002 | Cox et al. | |
| 6,634,313 B2 | 10/2003 | Hanawa et al. | |
| 6,755,150 B2 | 6/2004 | Lai et al. | |
| 6,855,906 B2 | 2/2005 | Brailove | |
| 2003/0015965 A1 | 1/2003 | Godyak | |
| 2004/0045506 A1* | 3/2004 | Chen et al. .................. | 118/723 I |

* cited by examiner

*Primary Examiner* — Mark Paschall
(74) *Attorney, Agent, or Firm* — Portland IP Law LLC

(57) ABSTRACT

A plasma generation apparatus includes: a chamber having a chamber lid and defining an airtight reaction region; a susceptor in the chamber; a gas supply means supplying a process gas to the chamber; and a toroidal core vertically disposed with respect to the susceptor through the chamber lid, comprising: a toroidal ferromagnetic core combined with the chamber, the toroidal ferromagnetic core having a first portion outside the chamber and a second portion inside the chamber, the second portion having an opening portion; a radio frequency (RF) power supply connected to the chamber; an induction coil electrically connected to the RF power supply, the induction coil rolling the first portion; and a matching circuit matching an impedance between the RF power supply and the induction coil.

18 Claims, 7 Drawing Sheets

PLASMA GENERATION APPARATUS

CROSS-REFERENCE TO RELATED PATENT APPLICATIONS

This application is a divisional application of U.S. patent application Ser. No. 11/356,947, filed on Feb. 16, 2006, the disclosure of which is incorporated by reference herein in its entirety, which claims priority to Korean Patent Application No. 2005-13187, filed on Feb. 17, 2005, in the Korean Intellectual Property Office, the disclosure of which is incorporated herein in its entirety by reference.

BACKGROUND OF THE INVENTION

1. Field of the Invention

The present invention relates to an apparatus for etching and depositing a wafer or a glass using a plasma source, more particularly, to a plasma generation apparatus generating plasma using an induction electric field induced a time-varying magnetic field of a toroidal core.

2. Description of the Related Art

Generally, the plasma generation apparatus using the plasma source includes a plasma enhanced chemical vapor deposition (PECVD) apparatus for a thin film deposition, a reactive ion etching (RIE) apparatus etching a deposited thin film, sputter and ashing or the like.

In addition, the plasma generation apparatus is classified with a capacitive coupled plasma (CCP) apparatus and an inductive coupled plasma (ICP) apparatus in accordance with an applying type of a radio frequency (RF) power. At this time, the former generates plasma using a RF electric field vertically formed between electrodes by applying the RF power to planar electrodes facing each other, and the latter changes a source material into plasma using the induction electric field induced by a RF antenna.

Among them, the CCP type is more utilized than the ICP type. However, since ion energy of the CCP type is relatively high, defect possibility thereof is high regarding parts of a substrate or an inner of the apparatus due to an ion bombardment. Further, there is a problem not capable of using it in a low-pressure region less than a few mTorr as well as a difficulty that a line width or a selection ratio should be controlled.

Whereas the ICP type is effectively able to generate plasma in the low-pressure region in comparison with the CCP type. Further, the ICP type has an advantage capable of obtaining plasma having a much higher density than the CCP type. In addition, in the ICP type, the RF power is independently applied to the substrate different from the CCP type that the substrate is loaded on a susceptor functioning as an electrode. Accordingly, there is an advantage that the ion energy entered the substrate can be independently controlled.

Figure 1:
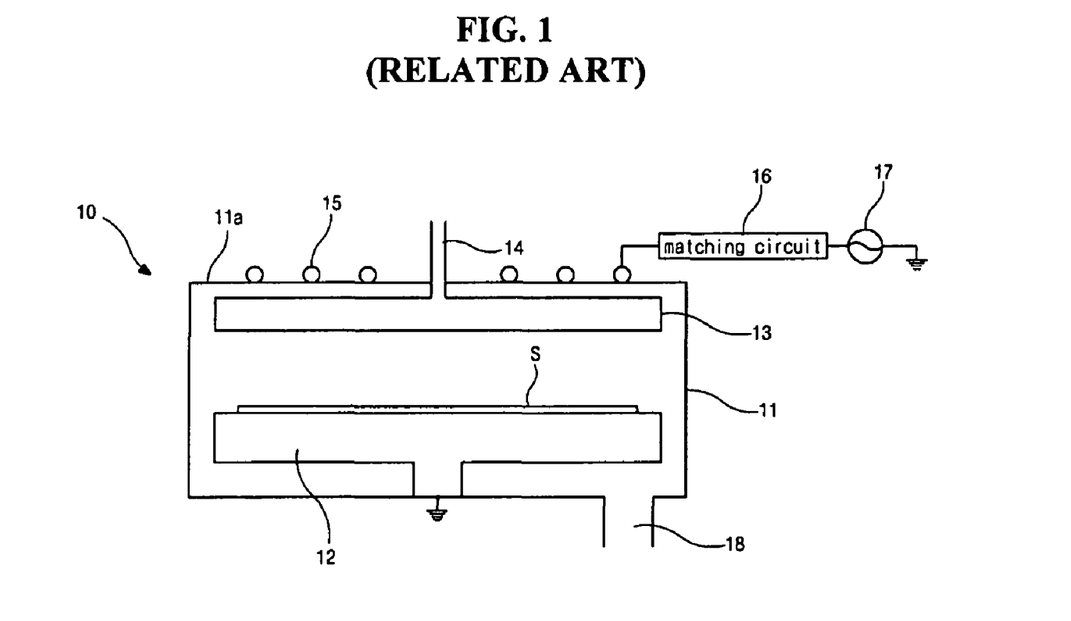
FIG. 1 is a schematic cross-sectional view showing an ICP type plasma generation apparatus according to the related art.

FIG. 1 is a schematic cross-sectional view showing an ICP type plasma generation apparatus according to the related art.

As shown in FIG. 1, an ICP type plasma generation apparatus includes a chamber 11 having a chamber lid 11a and defining an airtight reaction region (not shown), a susceptor 12 in the chamber 11 and having a substrate "s," a shower head 13 spraying a source material on a top surface of the susceptor 12, and a gas intake pipe 14 flowing the source material in the shower head 13.

Further, a RF antenna 15 supplying a RF power to the chamber 11 is disposed over the chamber lid 11a in order to change the source material into plasma. A RF power supply 17 is connected to the RF antenna 15.

A matching circuit 16 between the RF antenna 15 and the RF power supply 17 plays a role of matching load impedance and source impedance in order to apply a maximum power to the RF antenna 15.

At this time, when the RF power supply 17 is applied to the RF antenna 15, a time-varying magnetic field having a vertical direction occurs and an electric field is induced by the time-varying magnetic field in the chamber 11, wherein an accelerated electron collides with an electrically neutral ionized gas by the induction electric field. Therefore, a radical having a strong oxidation power is generated and the electron and the radical are changed into a mixture gas of a plasma state, so the radical is entered the substrate "s" and a process such as depositing and etching or the like is performed.

At this time, a different bias power (not shown) from the RF power supply 17 may be applied to the susceptor 12 in order to control an incident energy of the radical entered the substrate "s."

Meanwhile, the susceptor 12 further includes a heater (not shown) therein for pre-heating the substrate "s" and an exhaust 18 under the chamber 11 exhausts a residual gas, for example, through a vacuum pump.

Figure 2:
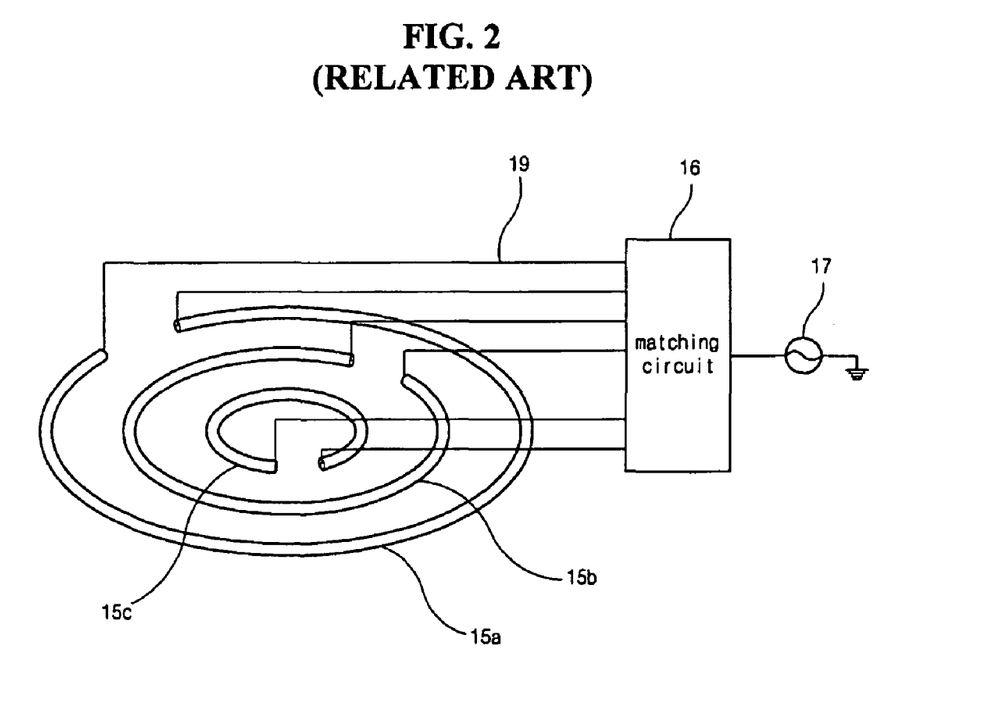
FIG. 2 is a schematic cross-sectional view showing a coil type antenna according to the related art.

Hereinafter, FIG. 2 is a schematic cross-sectional view showing a coil type antenna according to the related art.

As shown in FIG. 2, a RF antenna 15 consists of a plurality of antenna coils 15a, 15b and 15c, wherein each of the antenna coils 15a, 15b and 15c is disposed over the chamber lid 11a and is connected to the RF power supply 17 via a matching circuit 16 by a RF cable 19. Accordingly, when the RF power supply 17 is applied to the chamber 11, the time-varying magnetic field, which is orthogonal in each of the antenna coils 15a, 15b and 15c is generated and an electric field is induced in surrounding of the time-varying magnetic field.

However, among the induction electric field generated by the time-varying magnetic field, an induction electric field, which is suffered a loss, exists in a top portion of the chamber 11 besides the induction electric field utilized for generating plasma in the chamber 11. Further, it becomes had a structure that a leakage flux is generated a lot without a specific magnetic field shielding means. Accordingly, a high voltage RF power should be supplied to the chamber 11 to obtain a predetermined induction electric field for plasma generation and maintenance, as a result, a pollution source may occur in an inner wall of the chamber due to thermalization of the sputtering and parts by the high energy ion, and a loss of the RF power is undesirably increased.

Figure 3:
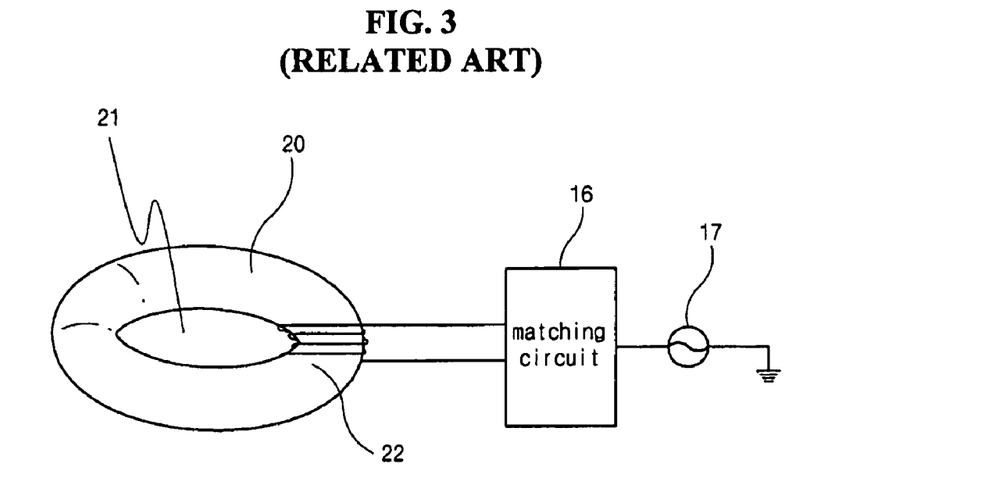
FIG. 3 is a schematic cross-sectional view showing a toroidal antenna according to the related art.

To solve the problems, a method forming an induction electric field using a toroidal antenna 20 is suggested as shown in FIG. 3.

FIG. 3 is a schematic cross-sectional view showing a toroidal antenna according to the related art.

As shown in FIG. 3, a RF power is applied to the chamber 110 (of FIG. 1) by rolling a induction coil 11 surround of the toroid antenna 20 of a ferromagnetic such as a ferrite, most of flux of a time-varying magnetic field generated by the RF current flowing the induction coil 22 are induced along an inside of the toroid antenna 20. Therefore, much bigger flux density can be obtained than that of the related art using the coil type RF antenna 15. Accordingly, since the electric field intensity, which is induced in an opening portion 21 of the toroid antenna 20 can be significantly increased, finally, dissociation and ionization rate of the source material can be increased and a high-density plasma can be easily obtained.

That is, the present invention relates to the plasma generation apparatus generating plasma using the toroidal antenna 20, more particularly, the plasma generation apparatus according to the present invention is suggested so as to easily generate a high-density plasma under a low temperature and a low pressure in order to be applied to a high-integrated circuit pattern.

Recently, necessity regarding plasma for low temperature deposition is gradually increased centering around a manufacturing process such as a low temperature polysilicon (LTPS), an electron luminescence (EL) and a carbon nano tube (CNT) or the like. However, the plasma for the low temperature deposition demanded in this process, should have a plasma density more than about $2 \times 10^{11}/cm^3$ and an electron energy more than about 4 eV. Generally, the more the electron energy is high, the more a film quality is good.

Further, the more a process pressure is low, the more the film quality is good. Therefore, if possible, the plasma should be effectively burned and maintained under the process pressure less than about 5 mTorr. In addition, properly, the ion energy and the plasma electric potential should be low to prevent a substrate defect due to the ion bombardment.

For example, although the LTPS process according to the related art is performed a crystallization method such that crystallization of polysilicon without rise of the substrate temperature by a laser irradiation after depositing an amorphous silicon using a CCP type, there is an advantage capable of directly depositing the polysilicon on the substrate without the crystallization process upon using the plasma for the low temperature deposition.

Further, in case of an organic electro luminescent device such that an anode, a hole transport layer, a organic luminescent layer, an electron transport layer and a cathode are sequentially formed therein, wherein the hole transport layer, the organic luminescent layer, and the electron transport layer are generally made of an organic material. Here, since the organic material consists of monomer material, it is weak against moisture or a high energy. Accordingly, to solve the problem, although a process including filling a raw material in a melting pot, vaporizing the raw material and depositing the vaporized raw material on the substrate is suggested, but it is difficult that this process is applied to a large size substrate and a deposition speed is also slow.

Recently, the plasma generation apparatus using the toroidal antenna is suggested as an external model that the toroidal antenna is disposed on a plasma generation chamber additionally formed on the chamber and an internal type that the toroidal antenna is completely formed within the chamber without being exposed outside the chamber. Among them, in the external type plasma generation apparatus, since the plasma generation chamber is quite spaced apart from the main chamber, it is difficult that a high plasma density at a position corresponding to the substrate. In addition, since an eddy current occurs in a sidewall of the plasma generation chamber covering the external toroidal antenna and the induction electric field has a high rate defected by the sidewall of the plasma generation chamber, it is inevitable that energy transmission efficiency is low. Consequently, there is a disadvantage considering plasma burning and maintenance.

Meanwhile, in the internal type toroidal antenna, since an induction coil rolling the toroidal antenna is disposed with the chamber as well as the toroidal antenna, plasma impedance effects impedance of the induction coil connected to the RF power. As a result, matching condition of the RF power becomes unstable and a vacuum seal should be demanded to protect the induction coil or the RF power supply line from plasma. Particularly, when an exothermic temperature of the toroidal antenna is more than a Curie temperature, a ferromagnetic substance is changed into a paramagnetic substance. Therefore, the time-varying magnetic field does not occur in the chamber.

In addition, since magnetic permeability is changed or power loss is increased due to exothermal, it is important to appropriately cool the toroidal antenna. However, since the toroidal antenna is disposed within the chamber in case of the internal type, it is not easy to cool the toroidal antenna.

SUMMARY OF THE INVENTION

Accordingly, the present invention is directed to a plasma generation apparatus having a toroidal core that substantially obviates one or more of problems due to limitations and disadvantages of the related art.

An object of the present invention is to provide a plasma generation apparatus that can easily generate plasma having a high density, high electron energy, a low pressure, low ion energy, and a low plasma electric potential.

An advantage of the present invention is to provide a toroidal antenna that can maximumly utilize a core property of a ferromagnetic substance as a toroid because it is possible the toroidal antenna simply and effectively to be cool and can solve problems that the induction coil rolling the toroidal antenna or the power supply line should be vacuum-sealed.

An advantage of the present invention is to provide a plasma generation apparatus that can easily widening a generating size of plasma by connecting at least two toroidal antenna modules.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a plasma generation apparatus includes: a chamber having a chamber lid and defining an airtight reaction region; a susceptor in the chamber; a gas supply means supplying a process gas to the chamber; and a toroidal core vertically disposed with respect to the susceptor through the chamber lid, comprising: a toroidal ferromagnetic core combined with the chamber, the toroidal ferromagnetic core having a first portion outside the chamber and a second portion inside the chamber, the second portion having an opening portion; a radio frequency (RF) power supply connected to the chamber; an induction coil electrically connected to the RF power supply, the induction coil rolling the first portion; and a matching circuit matching an impedance between the RF power supply and the induction coil.

In another aspect, a plasma generation apparatus includes: a chamber having a chamber lid and defining an airtight reaction region; a susceptor in the chamber; a gas supply means supplying a process gas to the chamber; and a toroidal core module including a toroidal core vertically disposed with respect to the substrate through the chamber lid, the toroidal core combined with the chamber, the toroidal core having a first portion outside the chamber and a second portion inside the chamber, the second portion having an opening portion, comprising; a power supply unit generating a radio frequency (RF) power by be connected to an external power supply; an induction coil electrically connected to the power supply unit, the induction coil rolling the toroidal core; a matching circuit matching an impedance between the power supply unit and the induction coil; and a housing surrounding the toroidal core, the power supply unit, the induction coil and the matching circuit.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 4:
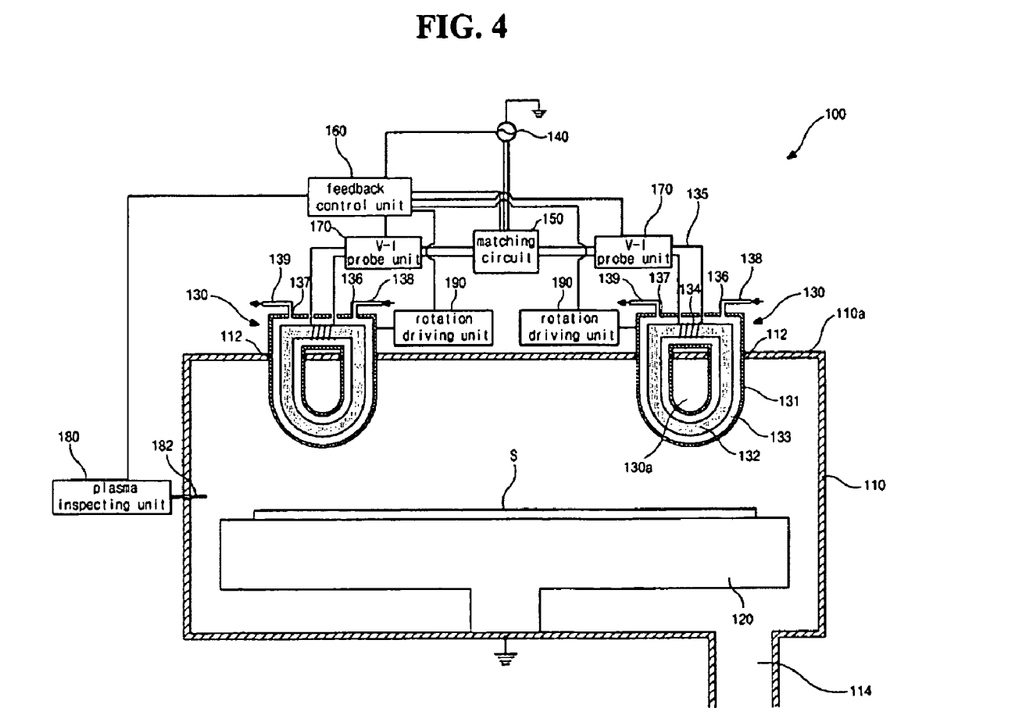
FIG. 4 is a schematic cross-sectional view showing a plasma generation apparatus according to an embodiment of the present invention.

FIG. 4 is a schematic cross-sectional view showing a plasma generation apparatus according to an embodiment of the present invention.

As shown in FIG. 4, a plasma generation apparatus 100 includes a chamber 110 defining an airtight reaction region and having a chamber lid 110a, a susceptor 120 in the chamber 110, and an exhaust 114 exhausting a residual gas toward bottom of the chamber 11.

It is noted that the plasma generation apparatus 100 includes a toroidal antenna 130 as a plasma source. Specifically, the toroidal antenna 130 is vertically combined with the chamber lid 110a, wherein the toroidal antenna 130 includes a first portion outside the chamber 110 and a second portion inside the chamber 110, and wherein the second portion has an opening portion 130a. At this time, the plasma generation apparatus 100 further includes an induction coil 134 rolling the first portion of the toroidal antenna 130 and a cover 131 covering the toroidal antenna 150 to protect it.

However, the toroidal antenna 130 may be combined with a lateral wall and a bottom portion of the chamber 110 in accordance with the kind of the apparatus as well as the mentioned position thereof. In addition, the number of the toroidal antenna 130 is particularly not limited.

Although the opening portion 130a of the toroidal antenna 130 is illustrated so as to show for a convenience sake, substantially, the opening portion 130a in each the toroidal antenna 130 may be disposed so as to face each other by rotating 90° with the toroidal antenna 130 for generating induction electric field with a parallel direction. However, the facing angle of the opening portion 130a may be controlled in accordance with property of process or apparatus.

Meanwhile, the induction coil 134 is connected to a RF power supply 140 supplying a RF power to the chamber 110. A matching circuit 150, which matches load impedance and source impedance, is disposed between the RF power and each induction coil 134. Although the RF power is supplied to each toroidal core 132 through one RF power supply 140 and one matching circuit 150 as shown in FIG. 4, it may connect another RF power supply and another matching circuit in each toroidal core 132 as following another embodiment. The RF power supply 140 according to the embodiment of the present invention supplies the RF power having a range within about 10 KHz to about 13.56 MHz.

Since the toroidal core 132 provides a route passing a magnetic field generated by the RF current flowing the induction coil 134 rolling the toroidal core 132, the toroidal core 132 may include one of a ferrite material and an iron powder material.

It is noted that the toroidal core 132 should have the opening portion 130a in which electric flux of the induction electric field passes in the central portion thereof. In other words, the shape of the toroidal core 132 is not limited as a "D"-like shape as shown in FIG. 5 when the toroidal core 132 is satisfied with the mentioned condition.

However, at least a portion of the opening portion 130a should be disposed in the chamber 110 to raise the plasma density by increasing energy transmission efficiency from the induction electric field generated by the toroidal core 132. In addition, if the portion of the toroidal core within the chamber 110 is directly exposed from plasma, it becomes a generation source of particles. Therefore, properly, the portion of the toroidal core 132 is covered with a cover 131. Specifically, the cover 131 includes one of ceramic, aluminum and stainless steel. Here, a nonconducting substance such as ceramic may be partially utilized for the cover 131 so as to block an eddy current that may be induced in metals such as aluminum and stainless steel.

The toroidal core 132 is combined with the chamber lid 110a and is covered with the cover 131. Further, an O-ring 112 is formed between the cover 131 and the chamber lid 110a for vacuum seal. When a space between the lateral wall of the cover 131 and the toroidal core 132 is utilized for a refrigerant flow route 133 by being spaced apart from each other, a heat generated from the toroidal core 132 is effectively cooled. Accordingly, a refrigerant inlet 136 and a refrigerant outlet 137 are formed in a position that a portion of the cover 131 disposed at top of the chamber lid 110a. In addition, a refrigerant intake pipe 138 and a refrigerant outtake pipe 139 connected to an external cooling system may be connected to the portion of the cover 131. At this time, since top space of the chamber lid 110a exists under an atmospheric pressure, it is easy to use air as a refrigerant but it is not limited.

Figure 5:
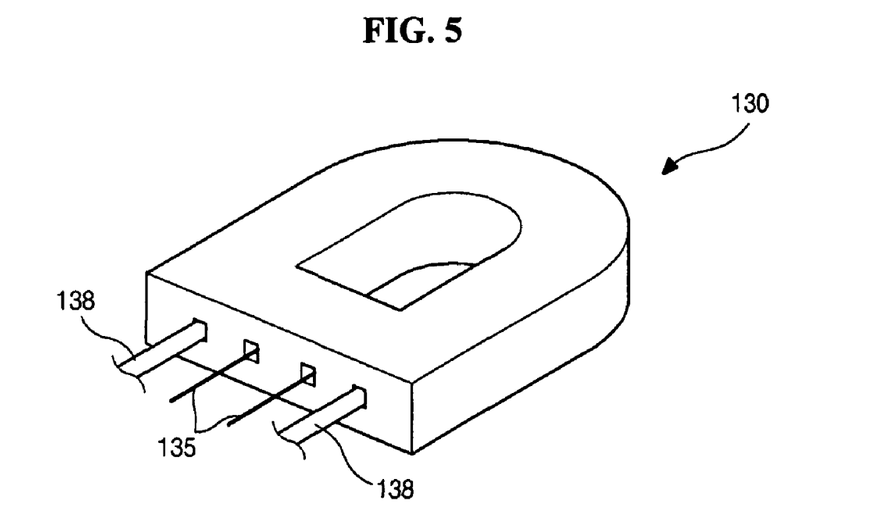
FIG. 5 is a schematic perspective view showing a toroidal antenna according to an embodiment of the present invention.

FIG. 5 is a schematic perspective view showing a toroidal antenna according to an embodiment of the present invention.

As shown in FIG. 5, in a toroidal antenna 130, a refrigerant intake pipe 138 and a refrigerant outtake pipe 139 are connected to a straight-line portion having a "D"-like shape thereof. Since inner spaces of the chamber are divided with atmospheric state and with vacuum state by the cover, it is natural that the cover 131 should be vacuum-sealed.

Further, the plasma generation apparatus 100 includes a feedback control unit 160 controlling a RF power supply 140 or a matching circuit 150 measuring a plasma condition in the chamber 110. Here, the feedback control unit 160 may be formed a portion of the control computer operated by an operator or may be formed another portion thereof.

Information of the plasma condition is detected through a plasma inspecting unit 180, wherein the detecting method may include a static probe type using a probe pole 182 as shown in FIG. 5 and a photodiagnosis type through a viewer port. The measured information of plasma parameter is utilized as a data controlling the RF power intensity or phase or a direction of each toroidal core 132 supplied to each toroidal core 132 from the feedback control unit 160.

Furthermore, a power supply line 135 between each toroidal core 132 and the matching circuit 150 includes a voltage-current (V-I) inspecting unit 170 where voltage and current of the RF power are checked for an accurate control of the RF power. Properly, additional phase shift circuit (not shown) is connected to the power supply line 135 connected to each toroidal core 132 to control phase of the RF power supply 140, and the phase shift circuit is controlled by the feedback control unit 160.

In addition, the plasma generation apparatus 100 includes a rotation driving unit 190 driving by the feedback control unit 160 and connected to each toroidal core 132, wherein the rotation driving unit 190 is driven by a driving motor and a predetermined gear combined with the driving motor. Here, the toroidal core 132 is rotated along a theta direction, that is, a vertical axis with respect to the substrate by the rotation driving unit 190.

When the toroidal core 132 is rotated, simultaneously, the cover 131 covering the toroidal core 132 is rotated. Accordingly, to rotate the cover 131 maintaining the vacuum seal at a boundary between the cover 131 and the chamber 110, a magnetic seal, which is made of a magnetic fluid, may be utilized. Although not shown regarding a means flowing into a process gas in the chamber 110, the means may be selected from an injector or a shower head over the susceptor 120. Alternatively, the means may correspond to a spray means spraying the process gas toward a center from edges of the susceptor 120.

Hereinafter, it will be explained about a process flow regarding the mentioned plasma generation apparatus 100 referring to FIG. 4.

First of all, when the substrate "s" is loaded on the susceptor 120 through a door (not shown), the time-varying magnetic field is generated in the toroidal core 132 by applying the RF power supply 140 to the induction coil 134 and by simultaneously spraying the process gas in the chamber 110 from outside of the chamber 110 after controlling a process pressure through the vacuum pumping.

Next, the induction electric field, which passes the opening portion 130a of the toroidal core 132, is generated by the time-varying magnetic field. At this time, since the toroidal core 132 is vertically disposed with respect to the susceptor 120, the induction electric field is parallel to the susceptor 120.

In addition, plasma, or mixture gas of a radical and an electron, is generated by dissociation and ionization of the process gas due to the induction electric field, the radical enters the substrate "s" and processes such as deposition and etching are performed. At this time, when the toroidal core 120 is prepared as a plurality of toroidal cores 120, the induction electric field having a much parallel and wide region with respect to the susceptor 120 can be formed, thereby generating plasma for a large size substrate.

Figure 6:
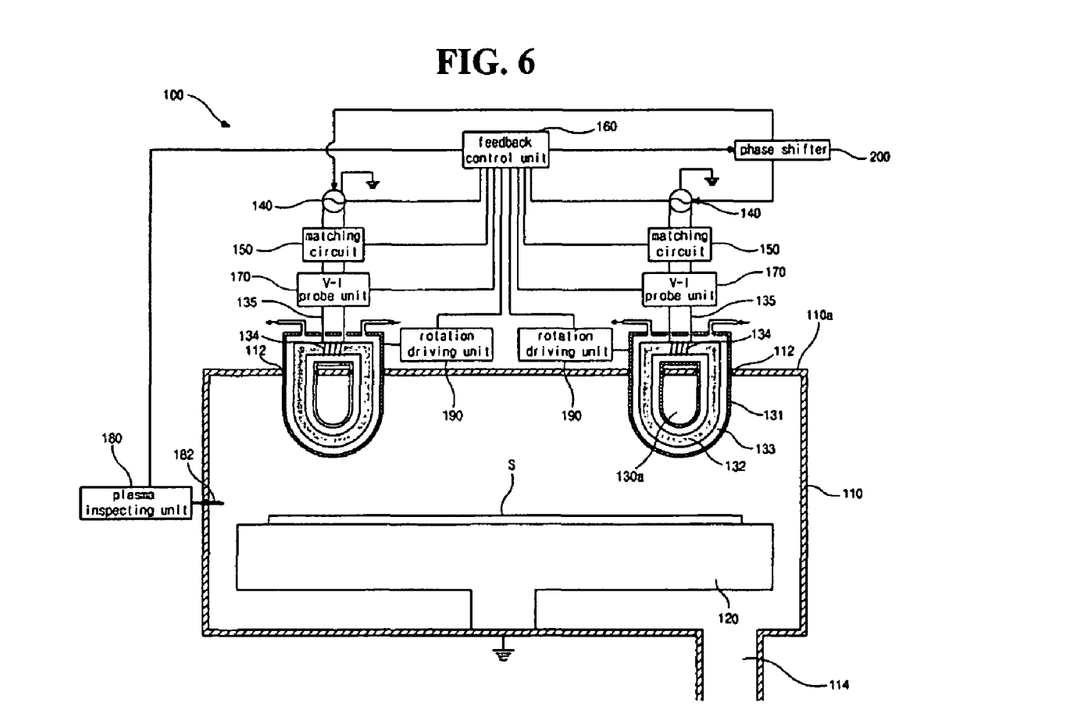
FIG. 6 is a schematic cross-sectional view showing a plasma generation apparatus according to an embodiment of the present invention.

FIG. 6 is a schematic cross-sectional view showing a plasma generation apparatus according to an embodiment of the present invention.

As shown in FIG. 6, it is noted that a plurality of RF power supplies 140 are connected to a plurality of toroidal core 132, respectively.

The plasma generation apparatus 100 further includes a phase shifter 200 that controls a phase of each RF power supply 140, wherein the phase shifter 200 is automatically controlled by the feedback control unit 160. Therefore, the plasma parameter and uniformity thereof can be accurately controlled in the chamber 110 based on the plasma parameter obtained through the plasma inspecting unit 180 as well as the RF power control, a direction control of the toroidal core 132 of each induction coil 134. As explained above, the plasma generation apparatus 100 using plasma according to the present invention includes the toroidal core 132 directly combined with the chamber lid 110a, further, the RF power supply 140, the matching circuit 150 or the like are connected to each toroidal core 132.

Hereinafter, another embodiment according to the present invention suggests a plasma generation apparatus including a toroidal core manufactured as a module having the power supply unit and the matching circuit. That is, a toroidal core module capable of combining to the chamber by a module unit is explained as follows.

Figure 7:
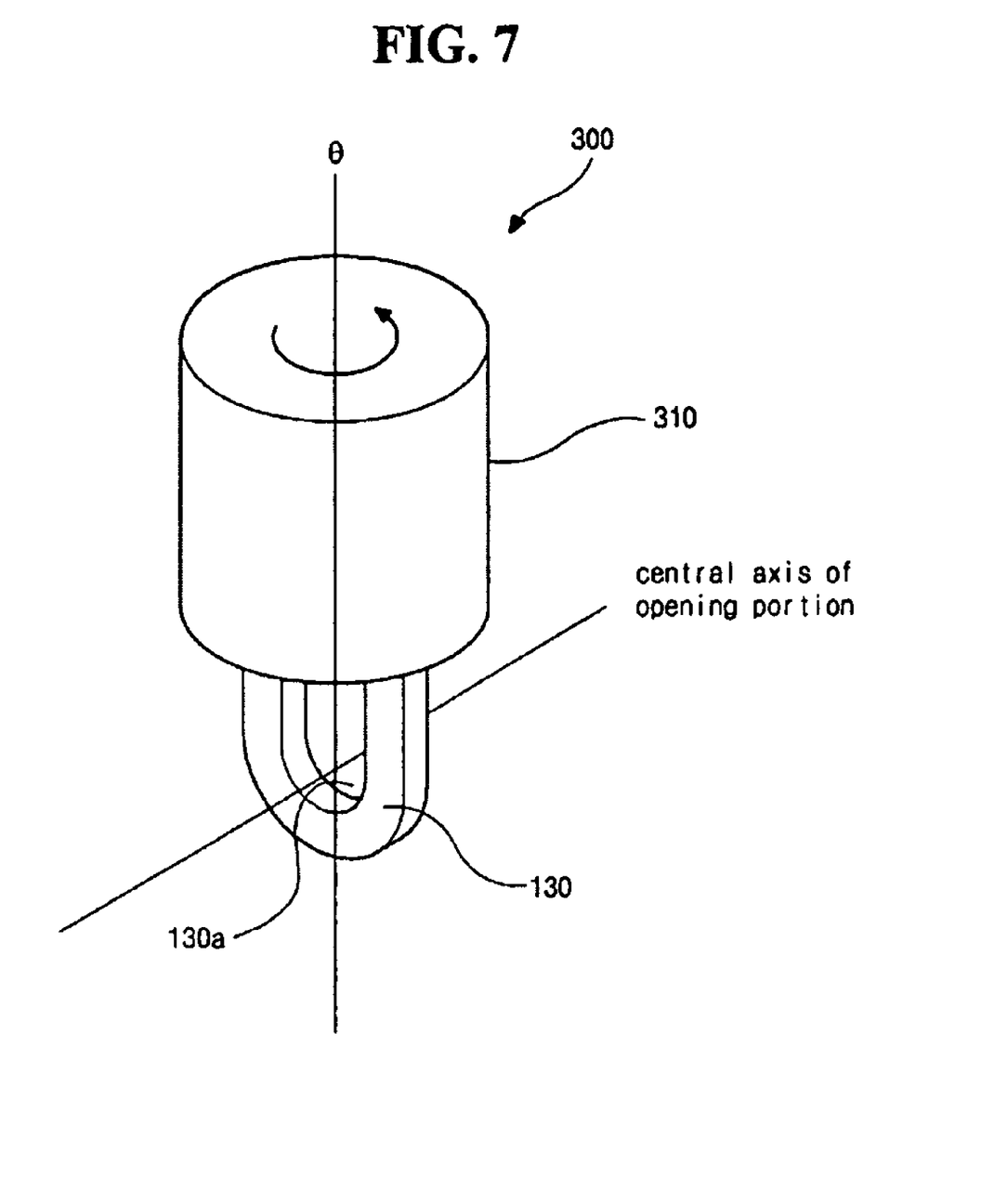
FIG. 7 is a schematic perspective view showing a toroidal core module according to an embodiment of the present invention.
Figure 8A:
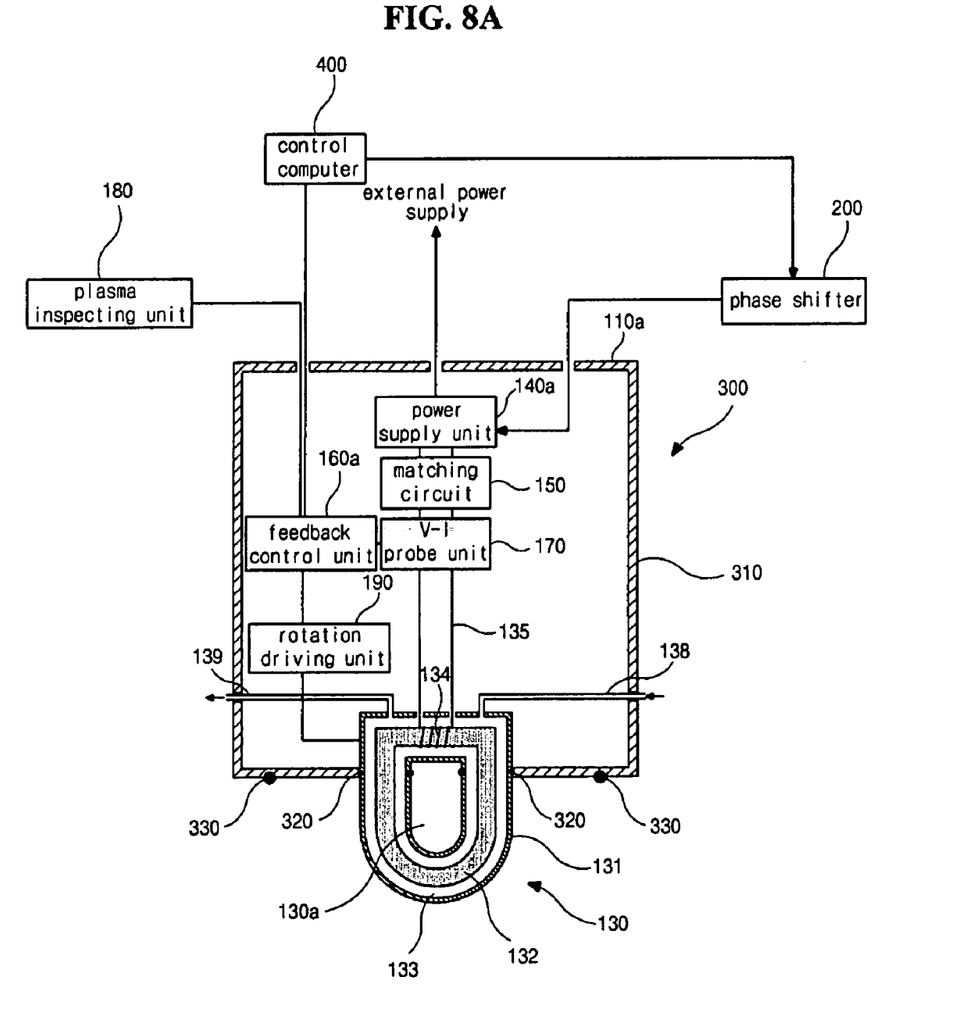
FIGS. 8A and 8B are schematic cross-sectional views showing plasma generation apparatuses according to embodiments of the present invention, respectively.
Figure 8B:
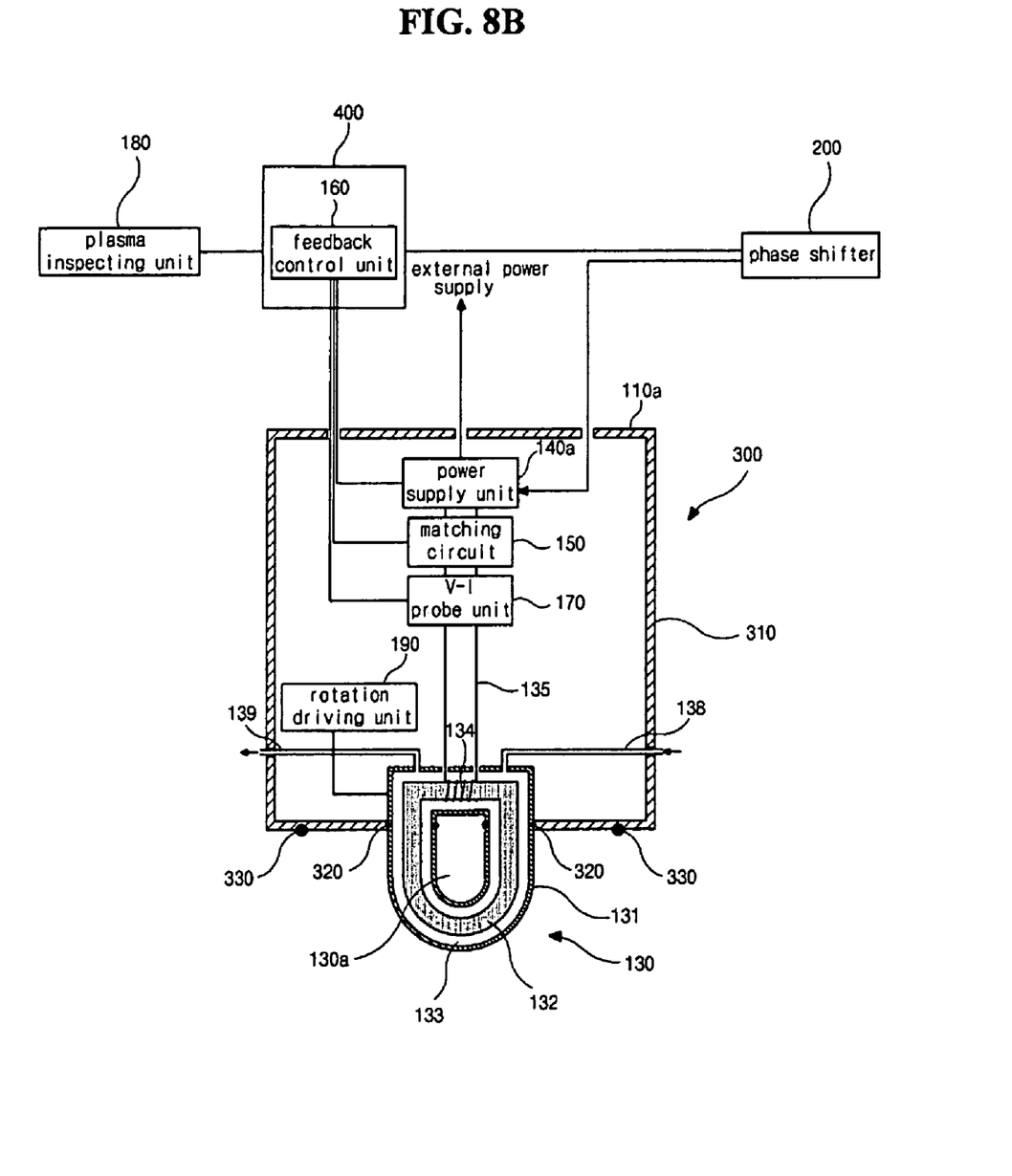

FIG. 7 is a schematic perspective view showing a toroidal core module according to an embodiment of the present invention. FIGS. 8A and 8B are schematic cross-sectional views showing plasma generation apparatuses according to embodiments of the present invention, respectively.

As shown in FIGS. 7, 8a and 8b, a toroidal core 132 is combined with an edge of a housing 310 of a can type. It is noted that the housing 310 surrounds a power supply unit 140a, a matching circuit 150, a V-I probe unit 170 and a rotation driving unit 190.

Particularly, the induction coil 134, which is connected to the power supply unit 140a, is disposed within the housing 310, the toroidal core 132 is projected outside the housing 310 and the induction electric field combined with the opening portion 130a is directly related to plasma generation, thereby raising energy transmission efficiency and plasma density.

Meanwhile, the toroidal core 132 is isolated from an outside of the chamber 110 by the cover 131, and an O-ring 320 is formed for vacuum seal at a boundary between the housing 310 and the cover 131. Here, the O-ring 320 may include a magnetic seal using a magnetic fluid in order to rotate the toroidal core 132 by the rotation driving unit 190 in the housing 310. The rotation driving unit 190 rotate the toroidal core 132 with respect to theta axis using a motor and a gear or the like, at this time, the central axis of the opening portion 130a is orthogonal with the theta axis.

Meanwhile, the housing 310 can be rotated by itself without rotating the toroidal core 132, in this case, a driving means rotating the housing 310 should be added outside the housing 310.

In addition, a space between the toroidal core 132 and the cover 131 spaced apart from each other is utilized as a refrigerant flow route 133 that the refrigerant can flow, and a portion of the cover 131 disposed within the housing 310 connects a refrigerant intake pipe 138 and a refrigerant outtake pipe 139 for flowing the refrigerant into the refrigerant flow route 133.

The O-ring 300 is formed to vacuum-seal a boundary between the housing 310 and the chamber lid 110a to combine the toroidal core module 300 with the chamber lid 110 as shown in FIGS. 8A and 8B.

In addition, a matching circuit 150 in the toroidal core module 300 plays a role matching impedance between the induction coil 134 and the power supply unit 140a, a V-I probe unit 170 checks voltage and current of the RF power between the induction coil 134 and the matching circuit 150 to accurately control the intensity of the RF power, and the rotation driving unit 190, which consists of a motor and a gear, controls a direction of the toroidal core 132. In addition, the toroidal core module 300 further includes a phase shift circuit (not shown) for phase control. Properly, the power supply unit 140a, the matching circuit 150, the V-I probe unit 170, the rotation driving unit 190 and the phase shift circuit (not shown) or the like are controlled by the feedback control unit 160. That is, the feedback control unit 160 controls the intensity of the RF power by controlling the power supply unit 140a and the matching unit 150 based on the plasma parameter information in the chamber 110 inputted from the plasma inspecting unit 180 outside toroidal core module 300. The phase of the RF power is controlled by controlling the phase shift circuit (not shown), thereby accurately controlling the plasma parameter and uniformity in the chamber by controlling a direction of the toroidal core 132 and driving the rotation driving unit 190.

As shown in FIG. 8A, a feedback control unit 160a in the housing 130 is formed to perform the control actions, at this time, an apparatus operator can operate an initial process condition through the control computer 400 by connecting the feedback control unit 160 and an external control computer 400 using a communication cable.

As shown in FIG. 8B, the feedback control unit 160 is formed outside the housing 310 so that the toroidal core module 300 could be control using the plasma parameter and uniformity information provided from the plasma inspecting unit 180. At this time, the feedback control unit 160 may be formed as a portion of the control computer 400 or as a different element from the control computer 400.

Since the external feedback control unit 160 is connected to the power supply unit 140a, the matching circuit 150, the V-I probe unit 170 and the rotation driving unit 190 in the module, this structure has an advantage capable of controlling more than two modules as a whole. At this time, the plasma parameter can be accurately controlled by automatically controlling the phase shifter 200 connected to each power supply unit 140a through the feedback control unit 160.

Figure 9:
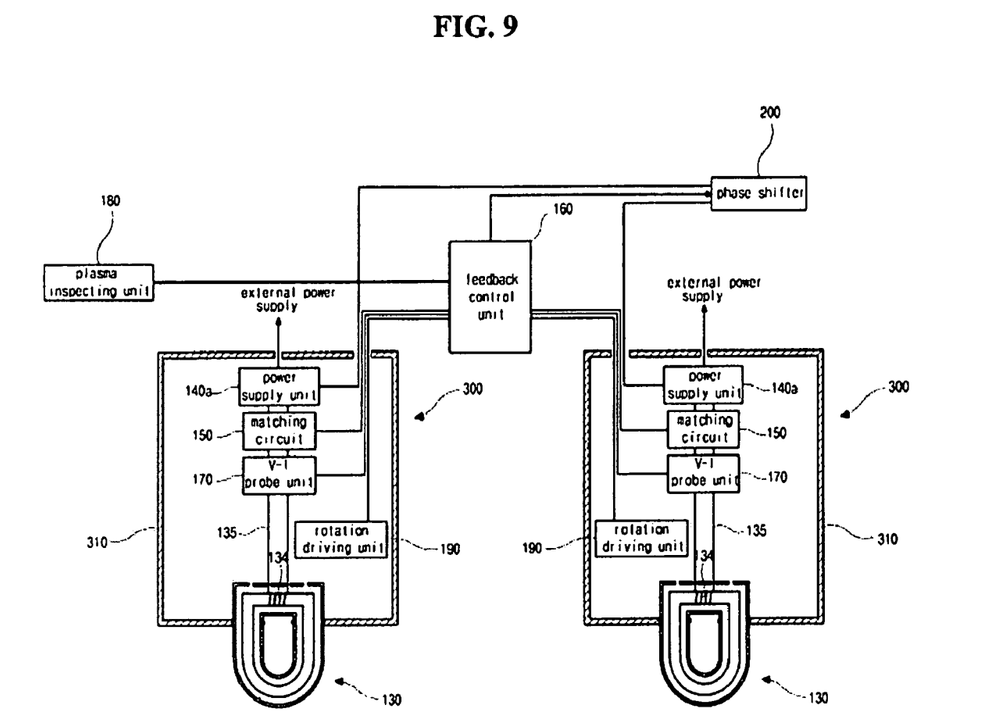
FIG. 9 is a schematic cross-sectional view showing a plasma generation apparatus having two toroidal core modules according to another embodiment of the present invention.

FIG. 9 is a schematic cross-sectional view showing a plasma generation apparatus having two toroidal core modules according to another embodiment of the present invention.

As shown in FIG. 9, although two toroidal core modules 300 are connected to the feedback control unit 160, the number of the toroidal core module 300 is not limited. To obtain uniformity of the plasma considering a large-sized substrate, the toroidal core module 300 should have much greater the number thereof. Here, when the toroidal core module 300 is formed as a plurality of elements, it may be formed with series or parallel.

According to the present invention, by disposing the opening portion of the toroidal core, which the induction electric field is combined with the toroidal core as a plasma source, within the chamber, energy transmission efficiency increases, thereby generating plasma having a high density and high electron energy. Further, plasma burning can be easily performed. In addition, the induction coil applying the RF power to the toroidal core combines with the toroidal core outside the chamber, vacuum sealing the power supply line and the cooling line do not have to any more, thereby raising cooling efficiency of the toroidal core.

Furthermore, since the induction electric field is formed in parallel with the substrate, the substrate defect by the ion bombardment can be effectively reduced.

Yet, in addition, the toroidal core, the induction coil, the RF power supply, the matching circuit, the rotation driving unit and the feedback control unit or the like are manufactured as one module, and the number of the module, the direction, and phase of the electric field or the like can be controlled, thereby easily obtaining uniformity of the process in a large-sized substrate.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A plasma generation apparatus, comprising:
   a chamber having a chamber lid and defining an airtight reaction region for generating a plasma;
   a susceptor in the chamber;
   a gas supply means supplying a process gas to the chamber; and
   a toroidal core vertically disposed with respect to the susceptor through the chamber lid, comprising:
   a toroidal ferromagnetic core combined with a lateral wall and a bottom portion of the chamber lid, the toroidal ferromagnetic core having a first portion outside the chamber lid and a second portion inside the chamber lid, the second portion having an opening portion;
   a radio frequency (RF) power supply connected to the chamber;
   an induction coil electrically connected to the RF power supply, the induction coil rolling the first portion; and
   a matching circuit matching an impedance between the RF power supply and the induction coil.

2. The apparatus according to claim 1, wherein the toroidal ferromagnetic core includes one of a ferrite material and an iron powder material.

3. The apparatus according to claim 1, further comprising a cover covering the toroidal ferromagnetic core.

4. The apparatus according to claim 3, wherein the cover includes one of ceramic, aluminum and stainless steel.

5. The apparatus according to claim 1, wherein the toroidal ferromagnetic core has a central axis parallel with a surface of the susceptor.

6. The apparatus according to claim 1, wherein the plasma generation apparatus has at least two toroidal ferromagnetic cores and the RF power supply, and wherein each of the at least two toroidal ferromagnetic cores connected to the RF power supply.

7. The apparatus according to claim 1, further comprising:
   a plasma-inspecting unit measuring a plasma parameter in the chamber;
   a feedback control unit controlling one of the RF power supply and the matching circuit according to an information of the plasma parameter to control a RF power transmitted to the toroidal ferromagnetic core; and
   a voltage-current (V-I) probe unit supplying the information of the plasma parameter to the feedback control unit by measuring a voltage and a current in a conducting wire between the matching circuit and the induction coil.

8. The apparatus according to claim 1, further comprising:
a plasma-inspecting unit measuring a plasma parameter in the chamber;
a feedback control unit controlling one of the RF power supply and the matching circuit according to an information of the plasma parameter to control a RF power transmitted to the toroidal ferromagnetic core; and
a rotation driving unit rotating the toroidal ferromagnetic core with a predetermined angle and controlled by the feedback control unit.

9. A plasma generation apparatus, comprising:
a chamber having a chamber lid and defining an airtight reaction region for generating a plasma;
a susceptor in the chamber;
a gas supply means supplying a process gas to the chamber; and
a toroidal core module including a toroidal core vertically disposed with respect to the susceptor through the chamber lid, the toroidal core combined with the chamber, the toroidal core having a first portion outside the chamber and a second portion inside the chamber, the second portion having an opening portion, comprising;
a power supply unit generating a radio frequency (RF) power by being connected to an external power supply;
an induction coil electrically connected to the power supply unit, the induction coil rolling the toroidal core;
a matching circuit matching an impedance between the power supply unit and the induction coil; and
a housing surrounding the toroidal core, the power supply unit, the induction coil and the matching circuit.

10. The apparatus according to claim 9, further comprising a cover covering the toroidal core.

11. The apparatus according to claim 9, wherein the toroidal core includes one of a ferrite material and an iron powder material.

12. The apparatus according to claim 9, wherein the RF power has a range within about 10 KHz to about 13.56 MHz.

13. The apparatus according to claim 9, further comprising:
a plasma-inspecting unit measuring a plasma parameter in the chamber; and
a feedback control unit controlling one of the power supply unit and the matching circuit according to an information of the plasma parameter; and
a voltage-current (V-I) probe unit supplying the information of the plasma parameter to the feedback control unit by measuring a voltage and a current of a conducting wire connecting the matching circuit and the induction coil in the housing.

14. The apparatus according to claim 9, wherein the plasma generation apparatus includes at least two toroidal core modules.

15. The apparatus according to claim 1, wherein the first portion and the second portion of the toroidal core forms a single body.

16. The apparatus according to claim 9, wherein the first portion and the second portion of the toroidal core forms a single body.

17. A plasma generation apparatus, comprising:
a chamber having a chamber lid and defining an airtight reaction region for generating a plasma;
a susceptor in the chamber;
a gas supply means supplying a process gas to the chamber; and
a toroidal core vertically disposed with respect to the susceptor through the chamber lid, comprising:
a toroidal ferromagnetic core combined with the chamber, the toroidal ferromagnetic core having a first portion outside the chamber and a second portion inside the chamber, the second portion having an opening portion, wherein the opening portion is positioned within the chamber and wherein the plasma is generated within the chamber by an induction electric filed passing in the opening portion;
a radio frequency (RF) power supply connected to the chamber;
an induction coil electrically connected to the RF power supply, the induction coil rolling the first portion; and
a matching circuit matching an impedance between the RF power supply and the induction coil.

18. A plasma generation apparatus, comprising:
a chamber having a chamber lid and defining an airtight reaction region for generating a plasma;
a susceptor in the chamber;
a gas supply means supplying a process gas to the chamber; and
a toroidal core module including a toroidal core vertically disposed with respect to the susceptor through the chamber lid, the toroidal core combined with the chamber, the toroidal core having a first portion outside the chamber and a second portion inside the chamber, the second portion having an opening portion, wherein the opening portion is positioned within the chamber and wherein the plasma is generated within the chamber by an induction electric filed passing in the opening portion, comprising;
a power supply unit generating a radio frequency (RF) power by be connected to an external power supply;
an induction coil electrically connected to the power supply unit, the induction coil rolling the toroidal core;
a matching circuit matching an impedance between the power supply unit and the induction coil; and
a housing surrounding the toroidal core, the power supply unit, the induction coil and the matching circuit.

\* \* \* \* \*